(12) United States Patent
Wang et al.

(10) Patent No.: US 12,068,585 B2
(45) Date of Patent: Aug. 20, 2024

(54) SYSTEM AND METHOD FOR PREVENTING THERMAL INDUCED FAILURES IN VERTICAL CAVITY SURFACE EMITTING LASER (VCSEL) ARRAY

(71) Applicant: Shenzhen Raysees AI Technology Co. Ltd., Shenzhen (CN)

(72) Inventors: Yang Wang, Dublin, CA (US); Yongxiang He, Sunnyvale, CA (US); Siva Lanka, Reno, NV (US); Dongseok Kang, Mt Pleasant, MI (US)

(*) Notice: Subject to any disclaimer, the term of this patent is extended or adjusted under 35 U.S.C. 154(b) by 608 days.

(21) Appl. No.: 17/290,821

(22) PCT Filed: Nov. 7, 2018

(86) PCT No.: PCT/CN2018/114383
§ 371 (c)(1),
(2) Date: May 3, 2021

(87) PCT Pub. No.: WO2020/093275
PCT Pub. Date: May 14, 2020

(65) Prior Publication Data
US 2021/0376574 A1    Dec. 2, 2021

(51) Int. Cl.
*H01S 5/42*  (2006.01)
*H01S 5/042* (2006.01)

(52) U.S. Cl.
CPC .......... *H01S 5/423* (2013.01); *H01S 5/0428* (2013.01)

(58) Field of Classification Search
CPC ... F21V 5/007; F21V 5/10; F21V 9/08; F21V 29/67; F21V 29/70; F21V 29/54;
(Continued)

(56) References Cited

U.S. PATENT DOCUMENTS 6,757,314 B2*  6/2004  Kneissl .............. H01L 21/2007
                                              372/50.1
7,949,024 B2*  5/2011  Joseph ................... H01S 5/423
                                              372/36
(Continued)

FOREIGN PATENT DOCUMENTS

CN      1883092 A    12/2006
CN    101640380 A     2/2010
(Continued)

OTHER PUBLICATIONS

Office action issued Nov. 1, 2022, in Chinese patent application No. 201880099293.X (with English language translation by sipo).
(Continued)

*Primary Examiner* — Vu A Vu
(74) *Attorney, Agent, or Firm* — Jigang Jin

(57) ABSTRACT

The present invention discloses a VCSEL array that is divided into at least a first and a second area. The first area covers the center of the array and is surrounded by the second area. The first area would experience higher temperature than the second area after the VCSELs in both areas are turned on for a given time period. VCSELs in the first area are electrically connected to a first metal layer portion. VCSELs in the second area are electrically connected to a second metal layer portion. The first and second metal layer portions are electrically insulated from each other.

18 Claims, 4 Drawing Sheets

(58) Field of Classification Search
CPC .......... F21V 29/763; F21V 29/89; F21K 9/00;
F21S 2/005; F21S 4/00; G03B 21/16;
G03B 21/2013; G03B 21/204; G03B
33/06; G09G 3/001; F21Y 2105/10; F21Y
2105/12; F21Y 2115/10; F21Y 2115/30;
H05B 47/00
USPC .......................................................... 372/34
See application file for complete search history.

(56) References Cited

U.S. PATENT DOCUMENTS

| | | | |
|---|---|---|---|
| 10,250,012 B2 * | 4/2019 | Barve | ................ H01S 5/423 |
| 10,944,242 B2 * | 3/2021 | Carson | ............... H01S 5/18327 |
| 2010/0303113 A1 | 12/2010 | Joseph | |
| 2012/0299801 A1 * | 11/2012 | Kitano | ................ F21K 9/00 |
| | | | 362/249.02 |
| 2013/0208753 A1 | 8/2013 | Van Leeuwen et al. | |
| 2017/0353012 A1 | 12/2017 | Barve et al. | |
| 2018/0048115 A1 | 2/2018 | Jiang et al. | |
| 2019/0036308 A1 * | 1/2019 | Carson | ............... H01S 5/0237 |
| 2020/0169065 A1 * | 5/2020 | Carson | ............... H01S 5/18327 |

FOREIGN PATENT DOCUMENTS

| | | |
|---|---|---|
| CN | 102856790 A | 1/2013 |
| CN | 103178442 A | 6/2013 |
| CN | 103178442 A | 6/2013 |
| CN | 103730833 A | 4/2014 |
| CN | 103730833 A | 4/2014 |
| CN | 107134713 A | 9/2017 |
| JP | 2005216925 A | 8/2005 |
| JP | 2005216925 A | 8/2005 |
| JP | 2008277780 A | 11/2008 |
| JP | 2008311499 A | 12/2008 |
| JP | 2012195436 A | 10/2012 |
| JP | 2016025129 A | 2/2016 |
| JP | 2016127175 A | 7/2016 |
| JP | 2017098532 A | 6/2017 |

OTHER PUBLICATIONS

Office action issued Mar. 31, 2023, in Chinese patent application No. 201880099293.X (with English language translation by Google).

* cited by examiner

SYSTEM AND METHOD FOR PREVENTING THERMAL INDUCED FAILURES IN VERTICAL CAVITY SURFACE EMITTING LASER (VCSEL) ARRAY

CROSS-REFERENCE TO RELATED APPLICATIONS

This application is the U.S. National Stage of International Application No. PCT/CN2018/114383, filed Nov. 7, 2018, the content of which is incorporated herein by reference in its entirety.

TECHNICAL FIELD

This invention generally relates to Vertical Cavity Surface Emitting Laser (VCSEL) array and specifically to system and method for preventing thermal induced failures in VCSEL arrays.

BACKGROUND ART

VCSELs are a type of semiconductor laser which emits an output laser beam perpendicular to the top planer surface of a VCSEL wafer. They are fabricated using well-known wafer processing and testing techniques. A larger number of VCSELs can be made on a wafer to form a one dimensional or two-dimensional VCSEL array. VCSEL arrays have many uses, including applications in three-dimensional (3D) sensing. 3D sensing has become a critical technology in navigation of autonomous vehicles, augmented reality (AR), virtual reality (VR), and facial identification.

One performance limitation of VCSEL arrays is the power dissipation and the related thermal effects under continuous-wave (CW) operation. Self-heating in a VCSEL is caused by the excessive heat and the accumulation of heat inside the laser cavity. The doped semiconductor distributed Bragg reflectors (DBRs) have high series resistance and are the main reason for the excessive heat generated. VCSELs also exhibit large thermal impedances because they are small and the DBRs have poor thermal conductivity. The resultant thermal problems include overheating of a VCSEL which reduces power output, causes higher thresholds, and changes wavelength of the VCSEL output. The problems become more prominent in VCSEL arrays. In particular, overheating of the central area of a two-dimensional VCSEL array, which becomes hotter than areas surrounding it after a period of operation, may cause thermal destruction and catastrophic failure of the device.

Thermal destruction of a VCSEL may start from a pre-existing defect. The defect may spread under certain conditions. In a VCSEL, defect propagation may be accelerated by the current density and junction temperature. If a defect occurs outside the active area of a VCSEL structure, it may propagate towards the active area gradually, since the active area is hotter. Once a defect occurs in the active area, intense nonradiative recombination results in a localized hot spot which causes the defect to spread rapidly. Growth of defects reduces the active area and thereby increases the current density, which speeds up the spread of defects further. Thus thermal runaway may occur and the device may experience catastrophic failure. In some cases, defects spread so rapidly that a VCSEL device may fail in hours after the defects enter the active area. Therefore, it is important to prevent overheating VCSEL, which may avoid acceleration of the defect growth and thus enhance reliability of the device.

A top view of a prior art VCSEL array 100 is shown in FIG. 1. Array 100 comprises VCSELs configured in a matrix which is a regular pattern. A regular pattern, as used herein, may mean various configurations that follow certain rules. An irregular pattern, as used herein, may mean various configurations which don't follow any rule. Irregular patterns include random or pseudorandom patterns. As shown in FIG. 1, VCSELs of array 100 are electrically connected to a metal layer 101. The small circular areas in the metal layer represent output windows of the VCSELs. It is noted that the array 100 may contain fewer or more VCSELs than what it is depicted here in practice. The VCSELs each represent a VCSEL structure or VCSEL emitter which emits a laser beam when charged with an electrical current. As used herein, a VCSEL, VCSEL structure, and VCSEL emitter have the same meaning and may be used interchangeably. A typical VCSEL may have an active region containing a multiple-quantum-well (MQW) structure, a bottom reflector region containing an n-type DBR, and a top reflector region containing a p-type DBR. The quantum well structure and DBRs are grown on a substrate in an epitaxial process. The substrate has n-type doping. The reflector regions and the substrate are electrically conductive. Metal contacts are deposited on the p-type DBR regions. A metal layer, such as metal layer 101, is deposited above the VCSEL structures as an anode terminal which electrically connects the metal contacts through vias. Another metal layer is deposited on the bottom substrate surface as a cathode terminal.

As shown in FIG. 1, VCSELs of array 100 shares a common anode which is metal layer 101. The VCSELs also share a common cathode (not shown in the figure). When VCSEL array 100 is powered on, all VCSELs emit an output laser beam. It is known that a central area of the VCSEL array, for instance, an area encircled by a dotted line 102, may experience more issues of heat dissipation. Consequently, the area encircled by dotted line 102 may get heated up and have higher temperature than areas surrounding it after a period of operation. In the worst-case scenario, thermal runaway may occur in the encircled area and VCSEL 100 may be destructed by catastrophic failure.

One known method to prevent thermal induced failures in VCSEL arrays is illustrated in a prior art VCSEL array 200 shown in FIG. 2. Like array 100 of FIG. 1, array 200 comprises a metal layer 201 which electrically connects all VCSELs of the array and functions as the common anode. Array 200 also has a metal layer deposited on the bottom substrate surface as the common cathode. But unlike array 100, where VCSELs are configured uniformly in the array area, array 200 has two areas with different VCSEL density values to prevent overheating from happening. As shown in FIG. 2, a central area encircled by a dotted line 202 has lower density than areas surrounding it. Because a central area of a VCSEL array is prone to get overheated, fewer VCSELs reduce power consumption and heat generation in the area and thus improve the overheating issues. But this design requires that the central area of a VCSEL array has lower density than areas surrounding it, which is not practical when equal or even higher VCSEL density is needed in the area.

SUMMARY OF INVENTION

Technical Problem

The present invention discloses a VCSEL array which is divided into two areas and VCSELs in the two areas are controlled separately. The two areas have different temperature after a period of operation. VCSELs in one area are electrically connected to a metal layer portion. VCSELs in the other area are electrically connected to another metal layer portion. In one operational mode, VCSELs in the two areas are driven with similar electrical currents; and in other operational modes, VCSELs in one of the areas are driven with reduced electrical currents or even powered off according to predetermined arrangements in order to prevent thermal destruction.

SOLUTION TO PROBLEM

Technical Solution

In one embodiment, a VCSEL array is divided into a central area and a surrounding area. The central area has higher temperature than the surrounding area after a period of operation. VCSELs in the central area and the surrounding area are electrically connected to different metal layer portions. In one operational mode, all VCSELs of the array are driven with similar electrical currents. In another operational mode, VCSELs in the central area are driven with reduced currents or powered off according to prearrangements to prevent thermal destruction.

In another embodiment of the present invention, a VCSEL array is divided into an area having higher VCSEL density and an area having lower VCSEL density. The area with higher density has higher temperature than the area with lower density after a period of operation. VCSELs in the two areas are electrically connected to different metal layer portions. In one operational mode, all VCSELs of the array are driven with similar electrical currents. In another operational mode, VCSELs in the area with higher density are driven with reduced currents or powered off according to prearrangements to prevent thermal destruction.

ADVANTAGEOUS EFFECTS OF INVENTION

Advantageous Effects

The present invention has advantages over prior art VCSEL arrays because an array area which has higher temperature after a period of operation is identified. VCSELs in the area and other areas are electrically connected to different metal layer portions for separate control to overcome overheating. For instance, VCSELs in the area may be driven with reduced currents or powered off to prevent thermal destruction and catastrophic failure of the VCSEL array.

BRIEF DESCRIPTION OF DRAWINGS

Description of Drawings

Figure 1:
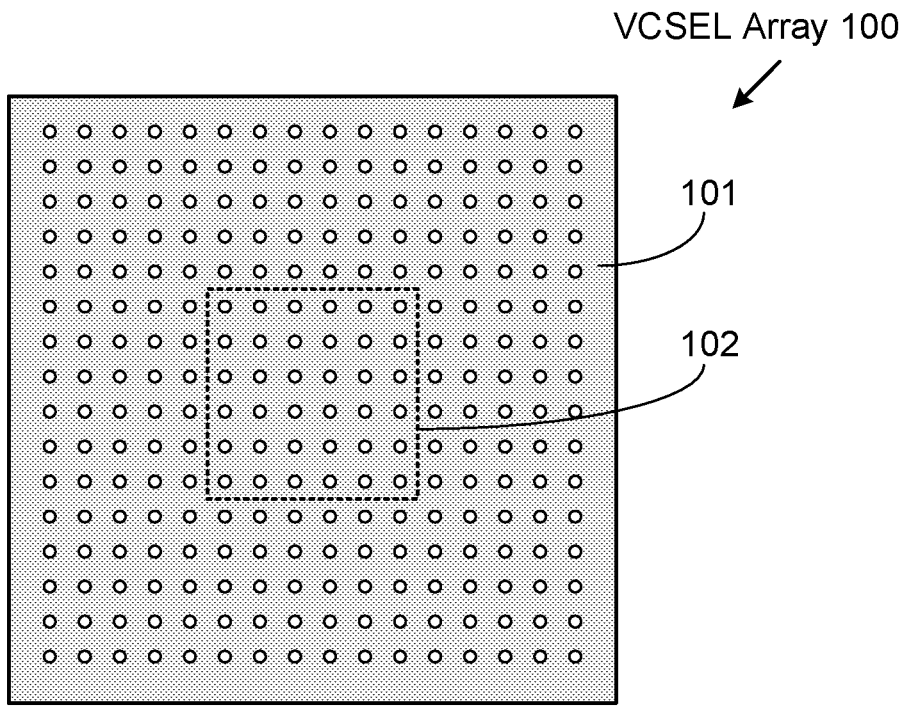

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the leftmost digit of a reference number identifies the drawing in which the reference number first appears.

Figure 2:
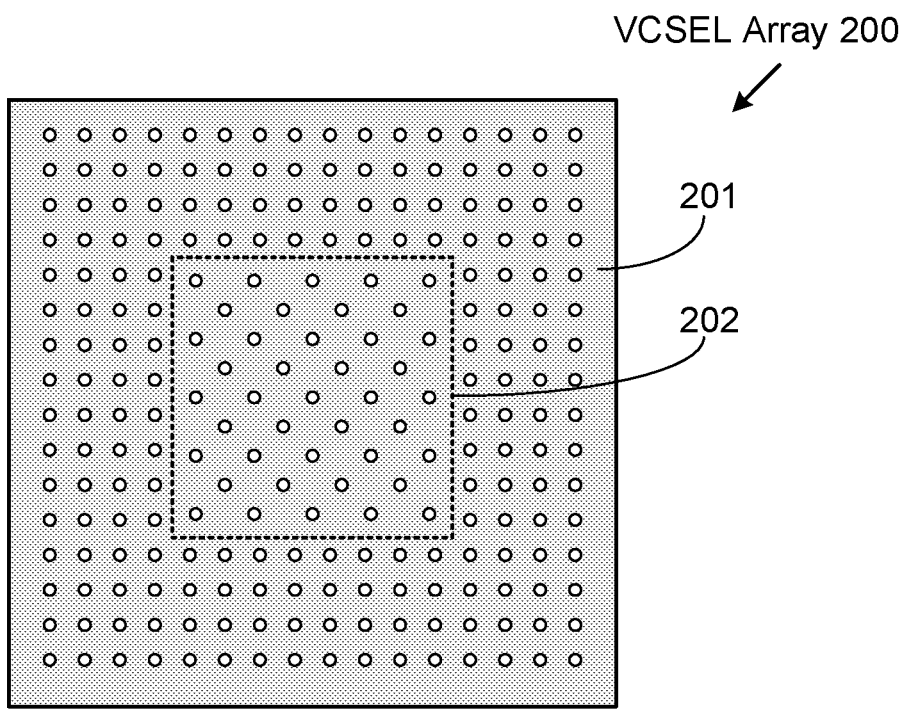
Figure 3:
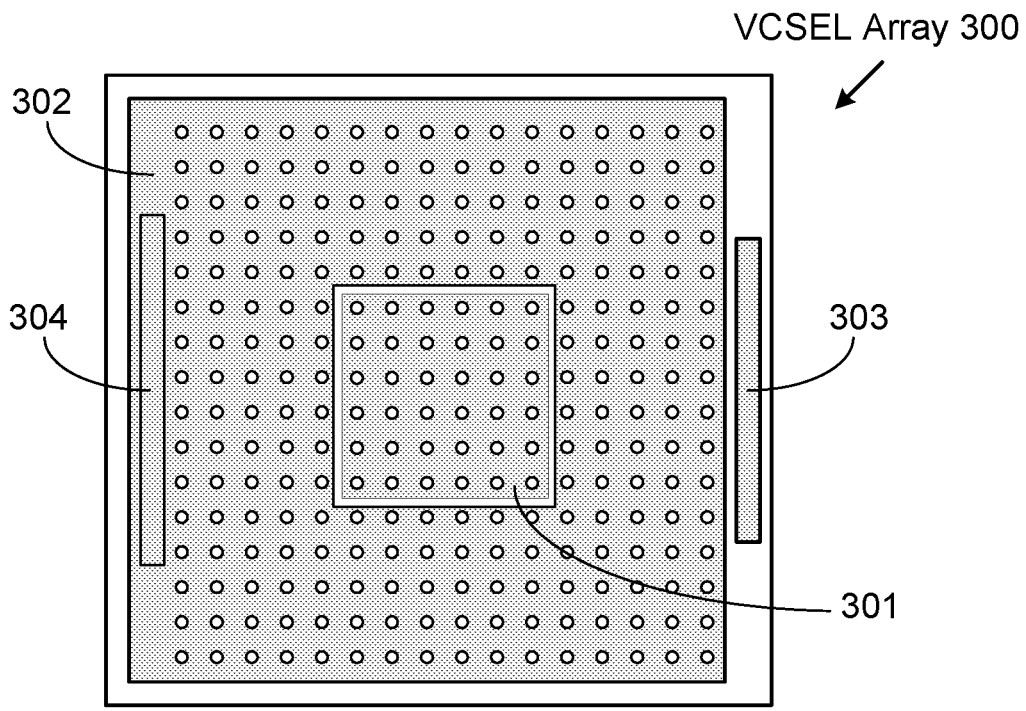
Figure 4:
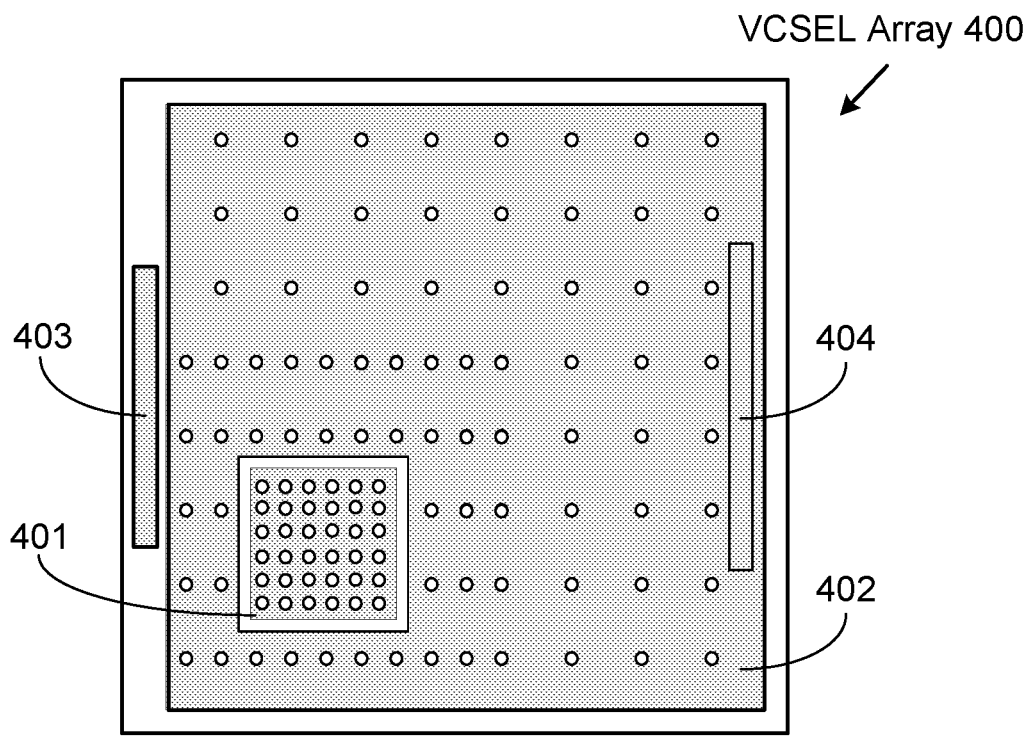
Figure 5:
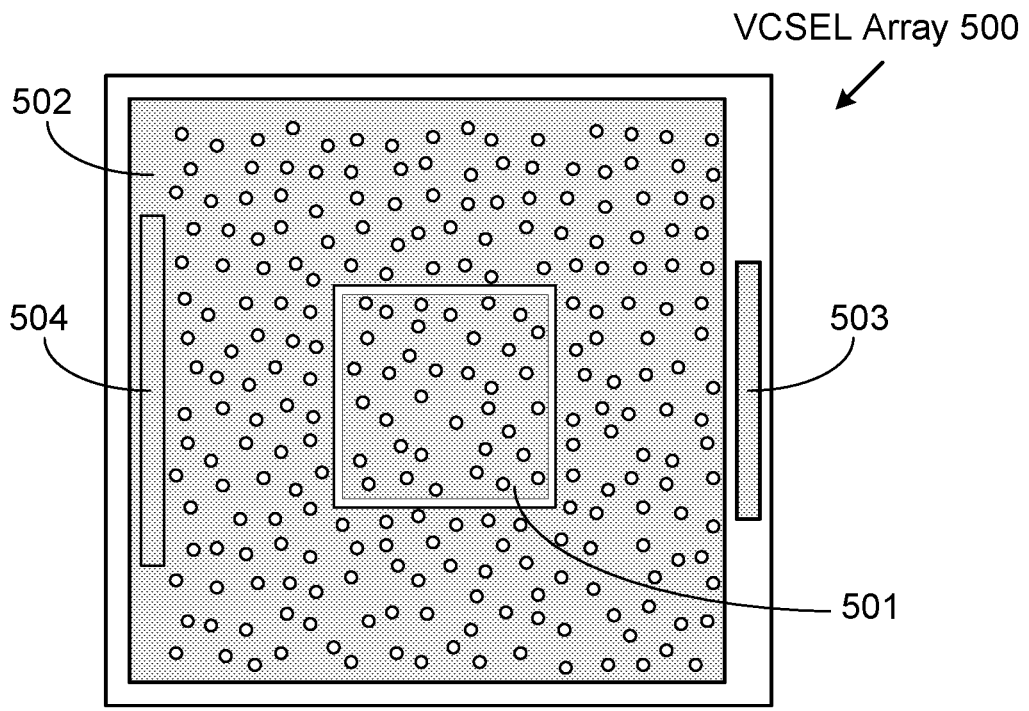
Figure 6:
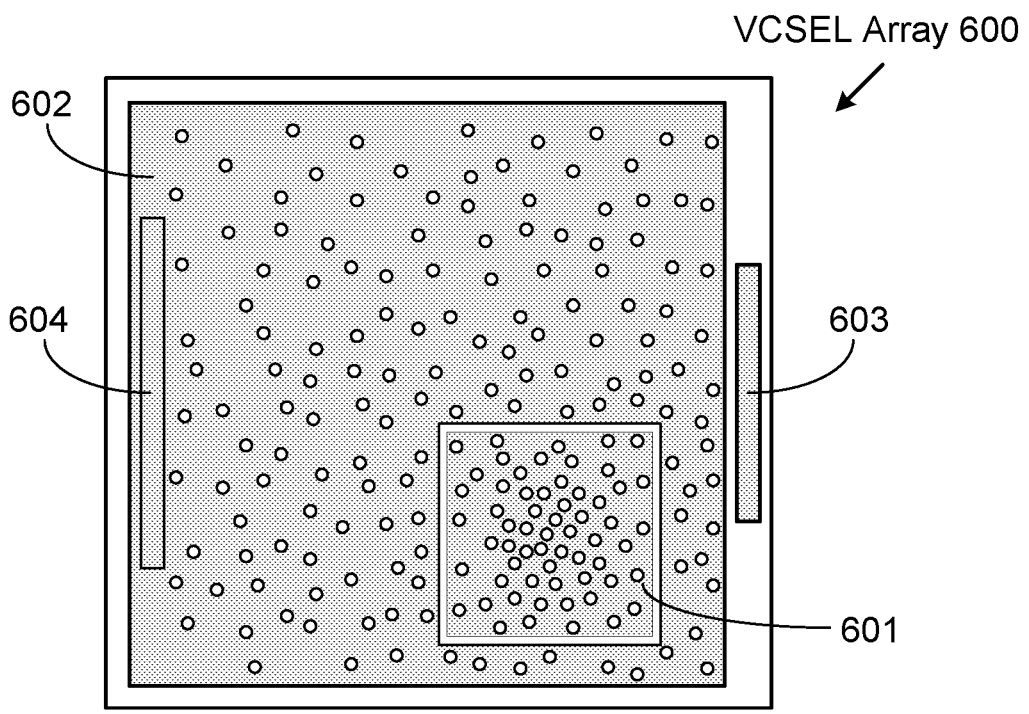
Figure 7:
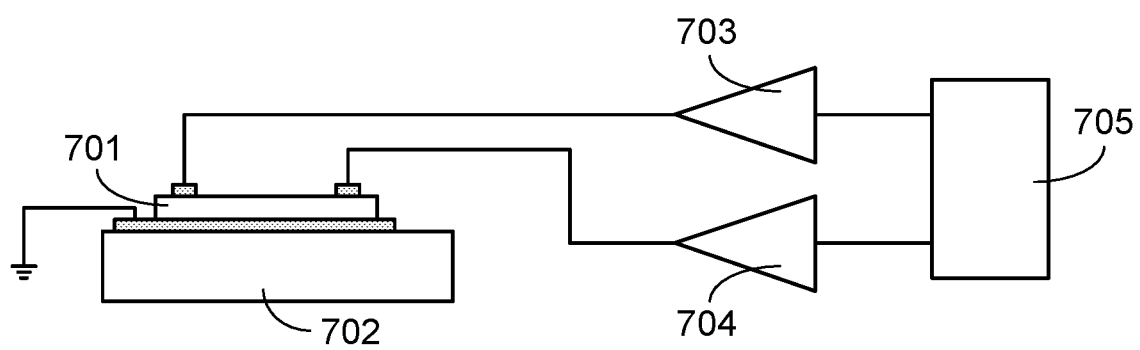

FIG. 1 illustrates a top view of a prior art VCSEL array with a regular pattern;

FIG. 2 illustrates a top view of a prior art VCSEL array with a special pattern;

FIG. 3 illustrates a top view of an exemplary VCSEL array with a regular pattern, according to one embodiment of the present invention;

FIG. 4 illustrates a top view of an exemplary VCSEL array with a special pattern, according to one embodiment of the present invention;

FIG. 5 illustrates a top view of an exemplary VCSEL array with an irregular pattern, according to one embodiment of the present invention;

FIG. 6 illustrates a top view of an exemplary VCSEL array with an irregular pattern, according to one embodiment of the present invention;

FIG. 7 illustrates an exemplary block diagram for VCSEL array control, according to one embodiment of the present invention.

MODE FOR THE INVENTION

Mode for Invention

FIG. 3 illustrates an exemplary VCSEL array 300 in a top view, according to one embodiment of the present invention. Array 300 comprises VCSELs arranged in a matrix, a regular pattern. The array is divided into two areas, a central area covered by a metal layer portion 301, and a surrounding area covered by a metal layer portion 302. The central area includes the center of the array. The two metal layer portions, as two common anode terminals for the VCSELs in the two areas, are electrically insulated from each other. They are electrically connected to VCSELs beneath them through corresponding vias. The metal layer portions may be formed from two metal layers deposited in sequence and separated by an insulation layer (e.g. Silicon Nitride) or formed from one metal layer. A bonding pad 303 is electrically connected to metal layer portion 301 and arranged for wire bonding. A region 304 of metal layer portion 304 is the other bonding pad, which is also arranged for wire bonding. Another metal layer (not shown in the figure) is deposited on the bottom substrate surface as the common cathode terminal for all VCSELs.

The central area of array 300, covered by metal layer portion 301, is prone to get overheated, because it contains VCSELs, i.e., heat generators and is surrounded by VCSELs, i.e., heat sources. Since VCSELs in the central area may be controlled independently using metal layer portion 301, overheating may be averted by reducing the drive currents charged to VCSELs in the central area or turning off VCSELs in the central area. Meanwhile, currents charged to VCSELs in the surrounding area may remain unchanged. After electrical currents are reduced to a certain level or turned off in the central area, heat generated there is decreased or eliminated. Thus overheating of array 300 may be prevented.

When VCSELs in the central area and the surrounding area are controlled respectively, array 300 may support multiple operational modes. In a first operational mode, all VCSELs of array 300 are powered on and charged with given currents. Array 300 provides an emitter array of a first regular pattern and uniform power output. In a second operational mode, VCSELs in the central area are charged with reduced currents, while VCSELs in the surrounding area are charged with given currents. Array 300 provides an emitter array of a second regular pattern where the central area has relatively lower output power. In a third operational mode, VCSELs in the central area are turned off, while VCSELs in the surrounding area are charged with given currents. Array 300 provides an emitter array of a third regular pattern where the surrounding area has uniform power output and the central area has no output power. The operational modes discussed here apply to embodiments below where a VCSEL array with any pattern is divided into two areas and VCSELs in the two areas are electrically connected to two metal layer portions.

Design of the central area may follow certain rules to control temperature of the array effectively. For instance, the temperature distribution of array 300 may be utilized to determine a boundary of the central area. Assume the VCSEL temperature at the center of array 300 is T1 and the VCSEL temperature at the edge of the array is T2 after VCSELs of the array are turned on for a given time period. T1 and T2 may be detected accurately using mature measurement methods, such as the infrared thermography method or the thermoreflectance method. T1 and T2 may also be determined by modeling which may involve calculation of heat generated by the VCSELs and a model simulating heat dissipation of the array. The boundary may be determined by several methods when the temperature distribution is obtained. For instance, the boundary may be at a middle point where the VCSEL temperature is the average of T1 and T2, a point where the VCSEL temperature is lower than T1 by a given value, or a point where the VCSEL temperature is higher than T2 by a given value. After a boundary line is calculated, it may be adjusted so that the central area has a predetermined shape, such as a square, a rectangle, a circle, or a specific shape. The surrounding area may surround the central area completely or partially.

FIG. 4 illustrates an exemplary VCSEL array 400 in a top view, according to one embodiment of the present invention. Array 400 includes two areas, a first area covered by a metal layer portion 401 and a second area surrounding the first area and covered by a metal layer portion 402. The first area is not at the center of array 400. It has higher VCSEL density than the second area. VCSELs in the first area have a regular pattern. Metal layer portions 401 and 402 are the common anode for VCSELs beneath them. They are connected to the VCSELs through vias embedded below the surface. Another metal layer portion (not shown in the figure) is deposited on the bottom substrate surface and works as the common cathode for all the VCSELs. Metal layer portions 401 and 402 are electrically insulated from each other. They may be formed from one metal layer or from two separate metal layers deposited in a sequential manner. Metal layer portions 401 and 402 have bonding pads 403 and 404 respectively. Bonding pad 403 is electrically connected to metal layer portion 401 via an embedded metal layer portion.

Since VCSELs in the first area has higher density and the first area is surrounded by the second area, the first area may have heat dissipation issues. To overcome the thermal problems, VCSELs in the first area may be driven according to certain arrangements. For instance, to overcome overheating in the first area, electrical currents charged to VCSELs in the first area may be reduced or turned off after a certain time period of operation, while electrical currents charged to VCSELs in the second area may remain unchanged. As heat generation is reduced, heat dissipation is improved and overheating may be prevented. In addition, the three operational modes used for array 300 of FIG. 3 apply to array 400 as well.

The boundary between the first and the second areas of array 400 may be designed following certain rules. For instance, the boundary may be determined by the VCSEL density distribution of the array or the temperature distribution of the array. In FIG. 4, the first area is configured to cover higher VCSEL density, which is relatively easy to do when there is a clear separation between a higher density region and a lower density region. The lower density region may surround the higher density region completely or partially.

The boundary between the first and the second areas may also be determined by the temperature distribution of array 400. Assume that the VCSEL temperature at the center of the first area is T1 and the VCSEL temperature at the edge of the array is T2 after VCSELs in the two areas are turned on for a given time period. T1 and T2 may be detected accurately by mature measurement methods, like the infrared thermography method or the thermoreflectance method. T1 and T2 may also be determined by modeling which may involve calculation of heat generated by the VCSELs and a model simulating heat dissipation of the array. The boundary may be determined by several methods after the temperature distribution is obtained. For example, the boundary may be at a middle point where the VCSEL temperature is the average of T1 and T2, a point where the VCSEL temperature is lower than T1 by a given value, or a point where the VCSEL temperature is higher than T2 by a given value. After a boundary line is calculated, it may be adjusted so that the first area has a predetermined shape, such as a square, a rectangle, a circle, or a specific shape.

FIG. 5 shows an exemplary VCSEL array 500 in a top view, according to one embodiment of the present invention. Array 500 comprises VCSELs configured in an irregular pattern. The array is divided into two areas, a central area covered by a metal layer portion 501, and a surrounding area covered by a metal layer portion 502. The central area includes the center of the array. Metal layer portions 501 and 502 are electrically insulated to each other and are connected to VCSELs beneath them through embedded vias respectively. Bonding pad 503 is electrically connected to metal layer portion 501 and area 504 is a bonding pad for metal layer portion 502.

Comparing FIG. 5 with FIG. 3, it is seen that array 500 is similar to array 300 in terms of configuration except that array 500 has an irregular pattern, while array 300 has a regular pattern. Thus, methods used for array 300 may be used for array 500 to determine a boundary between the central area and the surrounding area and to prevent overheating by adjusting electrical currents charged to VCSELs in the central area. Additionally, the three operational modes used for array 300 apply to array 500 as well.

FIG. 6 shows an exemplary VCSEL array 600 in a top view, according to one embodiment of the present invention. Array 600 comprises VCSELs configured in an irregular pattern. The array is divided into two areas, a first area covered by a metal layer portion 601, and a second area covered by a metal layer portion 602. The first area has higher VCSEL density than the second area. The first area may be at various positions of array 600, completely or partially surrounded by the second area. Metal layer portions 601 and 602 are electrically insulated to each other and are connected to VCSELs beneath them through embedded vias respectively. Bonding pad 603 is electrically connected to metal layer portion 601 and area 604 is a bonding pad for metal layer portion 602.

It is seen that array 600 is similar to array 400 of FIG. 4 in terms of configuration except that they have the first areas at different positions and array 600 has an irregular pattern, while array 400 has a regular pattern. Thus, methods used for array 400 may be used for array 600 to determine a boundary between the first area and the second area and to prevent overheating by adjusting electrical currents charged to VCSELs in the first area. Additionally, the three operational modes used for array 300 of FIG. 3 apply to array 600 as well.

In FIG. 7, an exemplary block diagram shows control of a VCSEL array. The VCSEL array is formed on a chip 701. It may comprise a plurality of VCSEL emitters configured in a first and a second area of the array. As aforementioned, the first and second areas may be a central and a surrounding area or areas having higher and lower VCSEL density. At least two metal layer portions may be deposited above the VCSEL structures. A first metal layer portion covers the first area and a second metal layer portion covers the second area. The first and second metal layer portions are the common anode terminals for VCSELs in the first and second areas respectively. All VCSELs of the array have a common cathode terminal which may be another metal layer portion deposited on the bottom surface of chip 701. Chip 701 is mounted on a submount 702. Driver circuits 703 and 704 are connected to the first and second metal layer portions respectively.

Driver circuits 703 and 704 are designed to supply electrical currents to VCSELs. The driver circuits are controlled by a controller 705. Controller 705 may include a data processing module, a communication module, and a memory module. The processing module may run programs stored at the memory module and send signals to driver circuits 703 and 704 to control electrical currents charged to the VCSELs. The communication module may communicate to other devices and pass signals to the processing module after receiving them. The processing module and communication module may be integrated on a single chip along with certain memory capacities. In addition, driver circuits 703 and 704 and controller 705 may be integrated on a chip as well. Moreover, driver circuits 703 and 704 and controller 705 may be integrated on chip 701 so that all the VCSELs and all components may be built on a chip.

When controller 705 is turned on, it causes driver circuits 703 and 704 to drive all VCSEL emitters of the array. Each VCSEL emitter generates a laser beam. As the VCSELs have the same structure and same dimensions and are driven by similar electrical currents, they consume similar power and produce similar amounts of heat. Thus, the first area may experience higher temperature than the second area and have overheat issues. To overcome overheating, it is arranged that VCSELs in the first area which are connected to driver circuit 703 may be charged with reduced currents or be turned off after VCSELs in the two areas are powered on for a given period of time. The given period of time may be determined and verified by measurement results. Alternatively, it may be arranged that VCSELs in the first area which are connected to driver circuit 703 may be charged with reduced currents or be turned off after it is detected that output power of the first area decreases by a certain value. Weakened power output from the first area may indicate that temperature there has risen to a certain level such that it starts affecting VCSEL performance. Thus, VCSELs in the first area may be controlled according to changes of the output power. For instance, a closed loop system may be arranged. The system may include an optical sensor (not shown in the figure), controller 705, and driver circuits 703 and 704. The optical sensor monitors output power emitted from the first and second areas and transmits measurement data to controller 705. Once controller 705 detects that output power of the first area decreases by a given value, it reduces the currents charged to VCSELs in the area or turn off the VCSELs according to prearrangements. After a certain time period, temperature in the first area may drop by a certain value. Then, controller 705 may increase the currents charged to the VCSELs or turn on the VCSELs. Aforementioned values may be determined and verified by measurements.

In above discussions, a VCSEL array is divided into two areas. VCSELs in the two areas are electrically connected to two metal layer portions respectively. When a VCSEL array has two regions which are separated by a certain distance and both regions have higher temperature than other parts of the array, the array may be divided into three areas, i.e., a first area, a second area, and a third area. The first and second areas correspond to the two regions and are surrounded by the third area completely or partially. Three metal layer portions may be deposited above the three areas which electrically connects VCSELs beneath them. To overcome overheating, VCSELs in the first and second areas may be turned off or charged with reduced electrical currents, while VCSELs in the third area remain unchanged in operation conditions.

Furthermore, the above embodiments and discussions apply to VCSEL arrays operated in both CW mode and pulse mode. As aforementioned, overheating of a VCSEL array may be prevented by reducing the heat generation in a central area or an area having higher VCSEL density. For instance, input electrical currents in a central area may be reduced by a given value. When a VCSEL array is in pulse mode, additional methods may be utilized to reduce the heat generated in a central or higher VCSEL density area. For instance, a shorter pulse width with the same cycle period, a longer cycle period or lower cycle frequency with the same pulse width, or a shorter pulse width with a longer cycle period or lower cycle frequency may reduce the power consumption and heat generation in a given period of time. Hence, when an array is in pulse mode operation, suppression of overheating may be achieved by shortening the pulse width and/or lowering the cycle frequency for VCSELs in a central or higher VCSEL density area.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

The invention claimed is:

1. A Vertical Cavity Surface Emitting Laser (VCSEL) array, comprising:
   a substrate;
   a plurality of VCSEL structures formed in an area on the substrate, each VCSEL structure comprising a first reflector region, an active region, and a second reflector region, each VCSEL structure emitting a laser beam when being powered on;
   a first metal layer portion that electrically connects a plurality of VCSEL structures which is in a central part of the area, wherein the central part of the area would experience higher temperature than a surrounding part of the area after VCSEL structures in the central and surrounding parts of the area are powered on for a given time period, and the surrounding part of the area surrounds the central part of the area; and
   a second metal layer portion that electrically connects a plurality of VCSEL structures which is in the surrounding part of the area, wherein at least one of pulse width, duty cycle, and cycle frequency is reduced for VCSEL structures in the central part of the area when the VCSEL array is in pulse mode operation according to predetermined arrangements.

2. The VCSEL array of claim 1, wherein the plurality of VCSEL structures in the area is formed on the substrate in an irregular pattern.

3. The VCSEL array of claim 1, wherein the plurality of VCSEL structures in the area is formed on the substrate in a regular pattern.

4. The VCSEL array of claim 1 further comprises a first and a second driver circuit, wherein the first driver circuit drives VCSEL structures in the central part of the area and is connected to the first metal layer portion, and the second driver circuit drives VCSEL structures in the surrounding part of the area and is connected to the second metal layer portion.

5. The VCSEL array of claim 4, wherein VCSEL structures in the central part of the area are charged with adjusted electrical currents or powered off according to predetermined arrangements.

6. The VCSEL array of claim 1, wherein the central part of the area has higher VCSEL density than the surrounding part of the area.

7. A Vertical Cavity Surface Emitting Laser (VCSEL) array, comprising:
a substrate;
a plurality of VCSEL structures formed in an area on the substrate, each VCSEL structure comprising a first reflector region, an active region, and a second reflector region, each VCSEL structure emitting a laser beam when being powered on;
a first metal layer portion that electrically connects a plurality of VCSEL structures which is in a first part of the area, the first part of the area surrounded by a second part of the area, and wherein the first part of the area would experience higher temperature than the second part of the area after VCSEL structures in the first and second parts of the area are powered on for a given time period; and
a second metal layer portion that electrically connects a plurality of VCSEL structures which is in the second part of the area, wherein the first part of the area has higher VCSEL density than the second part of the area.

8. The VCSEL array of claim 7, wherein the first part of the area covers a center of the VCSEL array.

9. The VCSEL array of claim 7, wherein the plurality of VCSEL structures in the area is formed on the substrate in an irregular pattern.

10. The VCSEL array of claim 7 further comprises a first and a second driver circuit, wherein the first driver circuit drives VCSEL structures in the first part of the area, and the second driver circuit drives VCSEL structures in the second part of the area.

11. The VCSEL array of claim 10, wherein VCSEL structures in the first part of the area are charged with adjusted electrical currents or powered off according to predetermined arrangements.

12. The VCSEL array of claim 10, wherein at least one of pulse width, duty cycle, and cycle frequency is reduced for VCSEL structures in the first part of the area when the VCSEL array is in pulse mode operation according to predetermined arrangements.

13. A Vertical Cavity Surface Emitting Laser (VCSEL) array, comprising:
a substrate;
a plurality of VCSEL structures formed in an area on the substrate, each VCSEL structure comprising a first reflector region, an active region, and a second reflector region, each VCSEL structure emitting a laser beam when being powered on;
a first metal layer portion that electrically connects a plurality of VCSEL structures which is in a predetermined first part of the area, the first part of the area having higher VCSEL density than a predetermined second part of the area, and wherein the first part of the area would experience higher temperature than the second part of the area after VCSEL structures in the first and second parts of the area are powered on for a given time period, and the second part of the area surrounds the first part of the area; and
a second metal layer portion that electrically connects a plurality of VCSEL structures which is in the second part of the area.

14. The VCSEL array of claim 13, wherein the plurality of VCSEL structures in the area is formed on the substrate in an irregular pattern.

15. The VCSEL array of claim 13, wherein the plurality of VCSEL structures in the area is formed on the substrate in a regular pattern.

16. The VCSEL array of claim 13 further comprises a first and a second driver circuit, wherein the first driver circuit drives VCSEL structures in the first part of the area, and the second driver circuit drives VCSEL structures in the second part of the area.

17. The VCSEL array of claim 16, wherein VCSEL structures in the first part of the area are charged with reduced electrical currents or powered off according to predetermined arrangements.

18. VCSEL array of claim 16, wherein at least one of pulse width, duty cycle, and cycle frequency is reduced for VCSEL structures in the first part of the area when the VCSEL array is in pulse mode operation according to predetermined arrangements.

* * * * *